(12) United States Patent
Ma et al.

(10) Patent No.: US 12,327,750 B2
(45) Date of Patent: Jun. 10, 2025

(54) ELECTROSTATIC CHUCK DEVICE, PRESSURE CALCULATION METHOD AND PROGRAM

(71) Applicant: HORIBA STEC, Co., Ltd., Kyoto (JP)

(72) Inventors: Lei Ma, Kyoto (JP); Andrew Price, Kyoto (JP); Tadahiro Yasuda, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 138 days.

(21) Appl. No.: 18/040,594

(22) PCT Filed: Jun. 22, 2021

(86) PCT No.: PCT/JP2021/023585
§ 371 (c)(1),
(2) Date: Feb. 3, 2023

(87) PCT Pub. No.: WO2022/030124
PCT Pub. Date: Feb. 10, 2022

(65) Prior Publication Data
US 2023/0274966 A1    Aug. 31, 2023

(30) Foreign Application Priority Data

Aug. 5, 2020 (JP) ................................. 2020-133376
Feb. 3, 2021 (JP) ................................. 2021-015473

(51) Int. Cl.
*H01L 21/683* (2006.01)
*H01J 37/32* (2006.01)

(52) U.S. Cl.
CPC .... *H01L 21/6833* (2013.01); *H01J 37/32449* (2013.01); *H01L 21/683* (2013.01)

(58) Field of Classification Search
CPC ............... H01L 21/683; H01L 21/6833; H01L 21/3065; H01L 21/66; H01L 21/6831;
(Continued)

(56) References Cited

U.S. PATENT DOCUMENTS 7,156,951 B1    1/2007  Gao et al.
2004/0123805 A1*  7/2004  Tomoyoshi ......... H01L 21/6831
                                                        118/724
(Continued)

FOREIGN PATENT DOCUMENTS

CN    101770973 A    7/2010
CN    111081517 A    4/2020
(Continued)

OTHER PUBLICATIONS

ISA Japan Patent Office, International Search Report Issued in Application No. PCT/JP2021/023585, Aug. 24, 2021, WIPO, 5 pages.

(Continued)

*Primary Examiner* — Danny Nguyen
(74) *Attorney, Agent, or Firm* — Alleman Hall & Tuttle LLP (57) ABSTRACT

An electrostatic chuck device for adsorbing an object by electrostatic force comprises an adsorption plate that has an adsorption surface to adsorb the object, a gas supplying line that supplies a thermally conductive gas to a gap between the adsorption surface and an adsorbed surface of the object and a pressure calculation section that calculates the pressure of the thermally conductive gas in the gap. The gas supplying line is provided with a flow rate resistive element that serves as a resistance when the thermally conductive gas flows. The pressure calculation section calculates the pressure of the thermally conductive gas in the gap based on the primary side pressure of the flow rate resistive element, the flow rate of the thermally conductive gas passing through the flow rate resistive element and the flow characteristic of the flow rate resistive element.

13 Claims, 10 Drawing Sheets

(58) Field of Classification Search
CPC ............... H01L 21/67253; H01J 37/32; H01J 37/32449
USPC ........................................................ 361/234
See application file for complete search history.

(56) References Cited

U.S. PATENT DOCUMENTS

| | | | | |
|---|---|---|---|---|
| 2008/0102209 | A1* | 5/2008 | Sasaki | H01L 21/67288 118/712 |
| 2016/0079105 | A1* | 3/2016 | Parkhe | H01L 21/6833 137/561 A |
| 2023/0011244 | A1* | 1/2023 | Hirata | H01L 21/67109 |

FOREIGN PATENT DOCUMENTS

| | | | |
|---|---|---|---|
| JP | 2000315680 A | 11/2000 | |
| JP | 2007201355 A | 8/2007 | |
| JP | 2009218592 A | 9/2009 | |
| JP | 2016136554 A | 7/2016 | |
| JP | 2016219830 A | 12/2016 | |
| JP | 2018096848 A | 6/2018 | |
| JP | 2019067846 A | 4/2019 | |
| JP | 2019117861 A | 7/2019 | |
| JP | 2020053576 A | 4/2020 | |
| TW | 201627524 A | 8/2016 | |
| TW | 201627542 A | 8/2016 | |

OTHER PUBLICATIONS

Taiwan Intellectual Property Office, Office Action and Search Report Issued in Application No. 11321081490, Oct. 24, 2024, 10 pages.
Taiwan Intellectual Property Office, Office Action and Search Report Issued in Application No. 110128300, Oct. 23, 2024, 10 pages.

* cited by examiner

ELECTROSTATIC CHUCK DEVICE, PRESSURE CALCULATION METHOD AND PROGRAM

FIELD OF THE ART

This invention relates to an electrostatic chuck device that adsorbs an object by electrostatic force, a pressure calculation method, and a program.

BACKGROUND ART

In a conventional semiconductor manufacturing process using a plasma processing device such as a plasma etching device and a plasma CVD device, an electrostatic chuck device is used to fix a sample such as a silicon wafer in a vacuum chamber. The electrostatic chuck device comprises an adsorption plate that adsorbs an object by electrostatic force and a metal base plate that contacts a back surface of the adsorption plate. By using the electrostatic chuck device to adsorb a back surface (an adsorbed surface) of a silicon wafer with the adsorption plate, the silicon wafer can be fixed and the plasma heat applied to the silicon wafer can be cooled by escaping the heat to a base plate side so that it is possible to achieve uniformity in surface temperature distribution.

There are minute irregularities on an adsorption surface of the adsorption plate or the adsorbed surface of the silicon wafer. Therefore, even when the silicon wafer is adsorbed by the electrostatic chuck device, a minute gap of about 10 μm in thickness is created between the adsorbed surface and the adsorption surface, and a physically contact area becomes small, which reduces efficiency of heat conduction. Conventionally, multiple gas supplying ports are provided on the adsorption surface of the adsorption plate to supply a thermally conductive gas to the gap between the adsorbed surface of the silicon wafer and the adsorption surface of the adsorption plate so that the plasma heat applied to the silicon wafer is efficiently released to the adsorption plate side (Patent document 1).

PRIOR ART DOCUMENTS

Patent Documents

Patent document 1: Japanese Unexamined Patent Application Publication No. 2020-053576

DISCLOSURE OF THE INVENTION

Problems to be Solved by the Invention

In the above-mentioned semiconductor manufacturing process using the plasma processing device, it is required to improve the uniformity of the surface temperature of the wafer in order to achieve high precision in the processing dimensions of the objects such as wafers. Since the uniformity of the wafer surface temperature is highly dependent on the pressure (hereinafter also referred to as "wafer back-surface pressure") of the thermally conductive gas applied to the adsorbed surface of the wafer, it is important to grasp the wafer back-surface pressure in order to improve the accuracy of the processing dimensions of the wafer. In addition, it is also important to grasp the wafer back-surface pressure in the semiconductor manufacturing process from a viewpoint of early detection of the occurrence and signs of abnormalities such as a decrease in the stability of the adsorption force of the electrostatic chuck device due to age-related deterioration or the like. However, conventionally, there has been no way to grasp the wafer back-surface pressure while the object is being adsorbed by the electrostatic chuck device.

The present claimed invention has been made to solve the above-mentioned problems, and a main object of this invention is to make it possible to grasp the wafer back-surface pressure in the semiconductor manufacturing process using the electrostatic chuck device.

Means to Solve the Problems

More specifically, an electrostatic chuck device in accordance with the present claimed invention is the electrostatic chuck device that adsorbs an object by electrostatic force and is characterized by comprising an adsorption plate that has an adsorption surface for adsorbing the object, a gas supplying line that supplies a thermally conductive gas to a gap between the adsorption surface and an adsorbed surface of the object, and a pressure calculation section that calculates pressure of the thermally conductive gas in the gap, and the gas supplying line is provided with a flow rate resistive element that acts as a resistance in case that the thermally conductive gas flows, and the pressure calculation section calculates the pressure of the thermally conductive gas in the gap based on primary side pressure of the flow rate resistive element, a flow rate of the thermally conductive gas that passes through the flow rate resistive element, and a flow rate characteristic of the flow rate resistive element.

In accordance with this arrangement, it is possible to calculate and grasp the wafer back-surface pressure by making use of the flow rate characteristic of the flow rate resistive element arranged in the gas supplying line, more specifically, the inherent characteristic indicating the relationship between the primary side pressure (for example, pressure in the gas supplying line) and the secondary side pressure (for example, wafer back-surface pressure) of the flow rate resistive element and the flow rate of the thermally conductive gas passing through the gas supplying line.

As a concrete embodiment of the electrostatic chuck device represented is that the gas supplying line comprises a gas supplying flow channel formed in the adsorption plate so as to open on the adsorption surface, and the flow rate resistive element is arranged in the gas supplying flow channel.

In accordance with this arrangement, since the flow rate resistive element is arranged in the gas suppling flow channel that opens on the adsorption surface of the adsorption plate, it is possible to calculate the wafer back-surface pressure more accurately.

The "flow rate resistive element" may be any as long as it has the flow rate characteristic that the flow rate of the thermally conductive gas passing through the flow rate resistive element is determined by the pressure of the primary side and the pressure of the secondary side, however, a laminar flow rate resistive element is particularly preferred. Since the laminar flow rate resistive element has an excellent processing accuracy and reproducibility, the pressure of the thermally conductive gas in the gap between the adsorption surface and the adsorbed surface can be calculated more accurately by using the laminar flow rate resistive element as the flow rate resistive element. In addition, since the laminar flow element resistive element has a high degree of freedom in its design, it is possible to improve freedom in the outer diameter of the outlet of the thermally conductive gas, and to expect suppressing the occurrence of arc discharges.

As a concrete embodiment of the above-mentioned pressure calculation section represented is the pressure calculation section that calculates the flow rate of the thermally conductive gas that passes through the flow rate resistive element based on the flow rate of the thermally conductive gas introduced into the gas supplying line and a relational expression indicating a material balance of the flow rate of the thermally conductive gas in the gas supplying line.

As a concrete embodiment of the electrostatic chuck device represented is the electrostatic chuck device that further comprises a pressure controller on which a flow rate sensor is loaded and that measures and controls the pressure of the thermally conductive gas in the gas supplying line, and the pressure calculation section calculates the pressure of the thermally conductive gas in the gap by using a pressure value measured by the pressure controller as the primary side pressure of the flow rate resistive element and a flow rate value measured by the flow rate sensor as the flow rate value of the thermally conductive gas introduced into the gas supplying line.

As another concrete embodiment of the electrostatic chuck device represented is the electrostatic chuck device that further comprises a pressure type flow rate controller that measures and controls the flow rate of the thermally conductive gas flowing in the gas supplying line, and the pressure calculation section calculates the pressure of the thermally conductive gas in the gap by using a pressure value measured by the pressure type flow rate controller as the primary side pressure of the flow rate resistive element, and a flow rate value measured by the pressure type flow rate controller as the flow rate value of the thermally conductive gas introduced into the gas supplying line.

In order to make it possible to diagnose whether or not there is abnormality on the back-surface of the wafer during processing plasma such as decrease in adsorption force to the wafer due to time-related deterioration, the electrostatic chuck device may further comprise a diagnostic section that diagnoses an abnormality in a pressure value of the thermally conductive gas applied to the adsorbed surface by comparing the calculated pressure of the thermally conductive gas with a predetermined reference pressure.

It is preferable that the pressure of the thermally conductive gas in the gas supplying line is adjusted so that the calculated pressure of the thermally conductive gas is a value within a predetermined range.

It is preferable that the electrostatic chuck device is so configured that the flow rate of the thermally conductive gas flowing in the gas supplying line is adjusted so that the calculated pressure of the thermally conductive gas is a value within a predetermined range.

It is preferable that the electrostatic chuck device is so configured that a plurality of gas supplying lines are provided, and each of the gas supplying lines is configured to supply the thermally conductive gas to a mutually different area between the adsorption surface and the adsorbed surface.

In accordance with this arrangement, it is possible to adjust the pressure applied to the back surface of the wafer for each area of the back surface.

As a concrete embodiment of the electrostatic chuck device represented is that the gas supplying line is configured to supply multiple types of the thermally conductive gases in an arbitrary mixing ratio.

In accordance with this arrangement, it is possible to reduce the amount of the expensive gas (for example, helium gas) by using a mixture of multiple types of thermally conductive gases, thereby reducing costs.

In addition, the electrostatic chuck device may also be designed to calculate the flow rate $Q_{LEAK}$ of the thermally conductive gas that leaks from the gap based on the time change of the pressure of the thermally conductive gas in the gas supplying line. In this case, it is preferable that the electrostatic chuck device calculates the flow rate $Q_{LEAK}$ based on the following expression (a).

$$Q_{LEAK} = \left(\frac{V}{ZR_u T_{gas}}\right)\frac{dP}{dt} \tag{a}$$

Where, V: volume of flow channel constituting gas supplying line, Z: compression coefficient of thermally conductive gas, $R_u$: gas constant of thermally conductive gas, and $T_{gas}$: temperature of thermally conductive gas flowing in gas supplying line, dP/dT: gas dP/dT: time change of pressure of thermally conductive gas in gas supplying line.

In accordance with this arrangement, it is possible to grasp the flow rate of the thermally conductive gas leaking from the gap between the object to be adsorbed and the adsorption surface so that the deterioration state of the electrostatic chuck device can be determined.

In the above-mentioned electrostatic chuck device, if the pressure of the thermally conductive gas supplied to the back-surface of the wafer is too large, the wafer might be separated from the adsorption surface. Therefore, a conventional electrostatic chuck device is so configured that a leak line that branches off from the gas supplying line and that has a resistive element is provided and an excess thermally conductive gas is exhausted at a predetermined flow rate. On the other hand, the leak line is also used to exhaust the thermally conductive gas remaining in the gas supplying line after the plasma process is completed, however, since the resistive element is arranged on the leak line, there is a problem that it takes time to exhaust the thermally conductive gas immediately after the plasma process is completed. As a result of this, in case that the electrostatic chuck device switches to the de-chucking state after the plasma processing is completed, the thermally conductive gas remaining in the gas supplying line may flow out into the vacuum chamber, which causes a spark that may damage the device.

Then it is preferable that the above-mentioned electrostatic chuck device comprises a main leak line that branches off from the gas supplying line and that is provided with a resistive element, a bypass line arranged to bypass the resistive element, an open/close valve arranged on the bypass line, and a valve control section that controls the open/close valve, and is so configured that a flow channel resistance of the bypass line is configured to be smaller than the flow channel resistance of the main leak line.

In accordance with this arrangement, in case that the plasma processing is completed and the electrostatic chuck device is switched to the de-chucking state, it is possible to immediately exhaust the thermally conductive gas through the bypass line whose flow resistance is relatively small by opening the open/close valve. With this configuration, it is possible to reduce the risk of sparking caused by thermally conductive gas flowing out into the vacuum chamber immediately after the plasma processing is completed.

In addition, a pressure calculation method in accordance with this invention is a pressure calculation method in an electrostatic chuck device that adsorbs an object by electrostatic force and is characterized by that the electrostatic chuck device comprises an adsorption plate having an adsorption surface that adsorbs the object, and a gas supplying line that supplies a thermally conductive gas to a gap between the adsorption surface and the adsorbed surface of the object, and a flow rate resistive element that acts as a resistance in case that the thermally conductive gas flows is arranged in the gas supplying line, and the pressure of the thermally conductive gas in the gap is calculated based on a primary side pressure of the flow rate resistive element, a flow rate of the thermally conductive gas passing through the flow rate resistive element, and the flow characteristic of the flow rate resistive element.

In addition, a pressure calculation program in accordance with this invention is a pressure calculation program for an electrostatic chuck device that adsorbs an object by electrostatic force and is characterized by that the electrostatic chuck device comprises an adsorption plate having an adsorption surface that adsorbs the object, and a gas supplying line that supplies a thermally conductive gas to a gap between the adsorption surface and the adsorbed surface of the object, and a flow rate resistive element that acts as a resistance in case that the thermally conductive gas flows is arranged in the gas supplying line, and the pressure calculation program causes a computer to function as a pressure calculation section that calculates the pressure of the thermally conductive gas in the gap is calculated based on a primary side pressure of the flow rate resistive element, a flow rate of the thermally conductive gas passing through the flow rate resistive element, and the flow characteristic of the flow rate resistive element.

In accordance with the pressure calculation method and the pressure calculation program, the same effect as the electrostatic chuck device of the above-mentioned present invention can be produced.

Effect of the Invention

In accordance with the present claimed invention having the above configuration, it is possible to grasp the wafer back-surface pressure in the semiconductor manufacturing process using the electrostatic chuck device.

EXPLANATION OF CHARACTERS

100 . . . electrostatic chuck device
111 . . . adsorption surface
31 . . . gas supplying line
31a . . . gas supplying port
34 . . . flow rate resistive element
W . . . wafer (object)
S . . . adsorbed surface
G . . . gap

BEST MODES OF EMBODYING THE INVENTION

One embodiment of the electrostatic chuck device 100 of the present claimed invention will be described below with reference to drawings.

Figure 1:
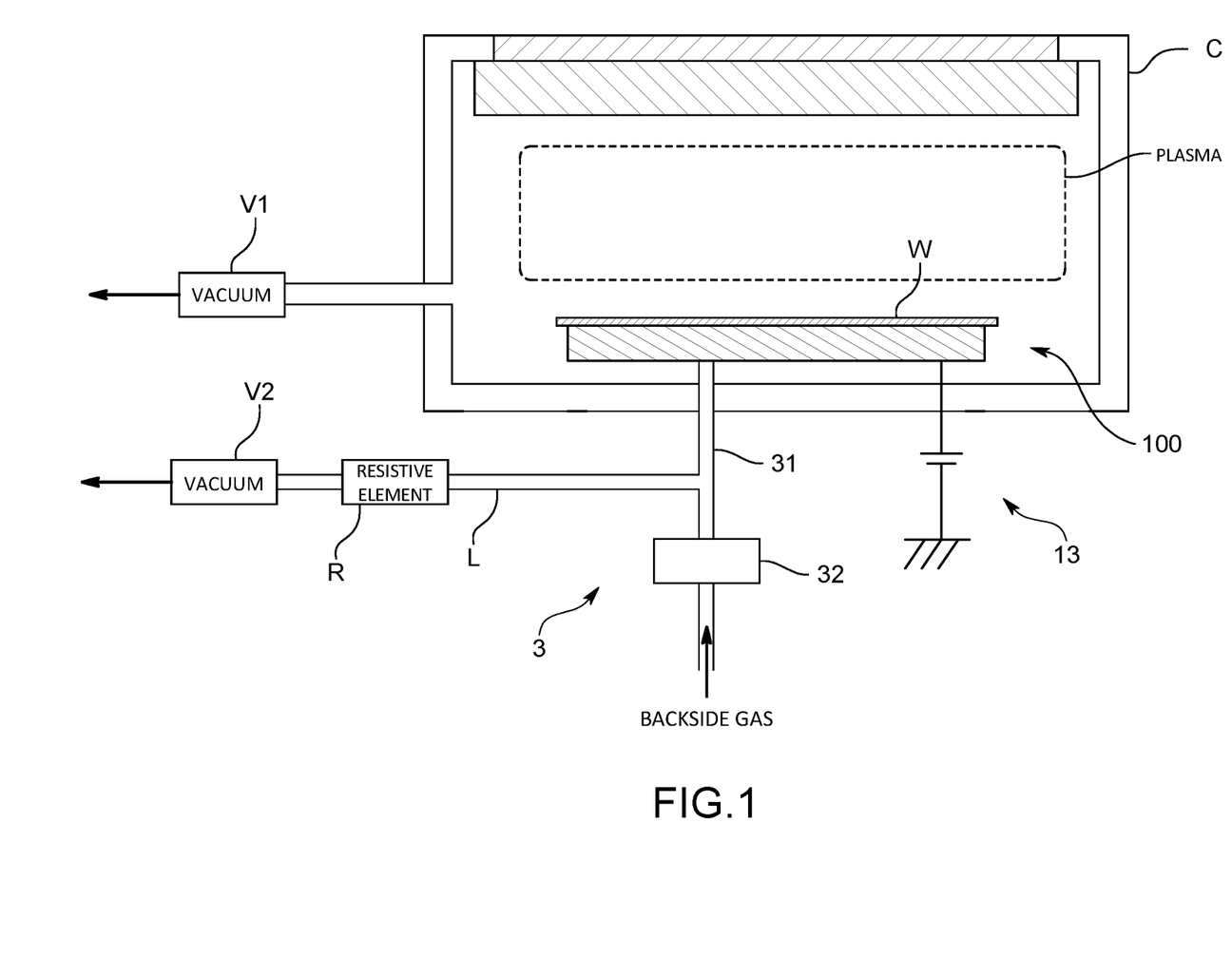
FIG. 1 is a schematic view showing an overall configuration of an electrostatic chuck device of this embodiment.
Figure 2:
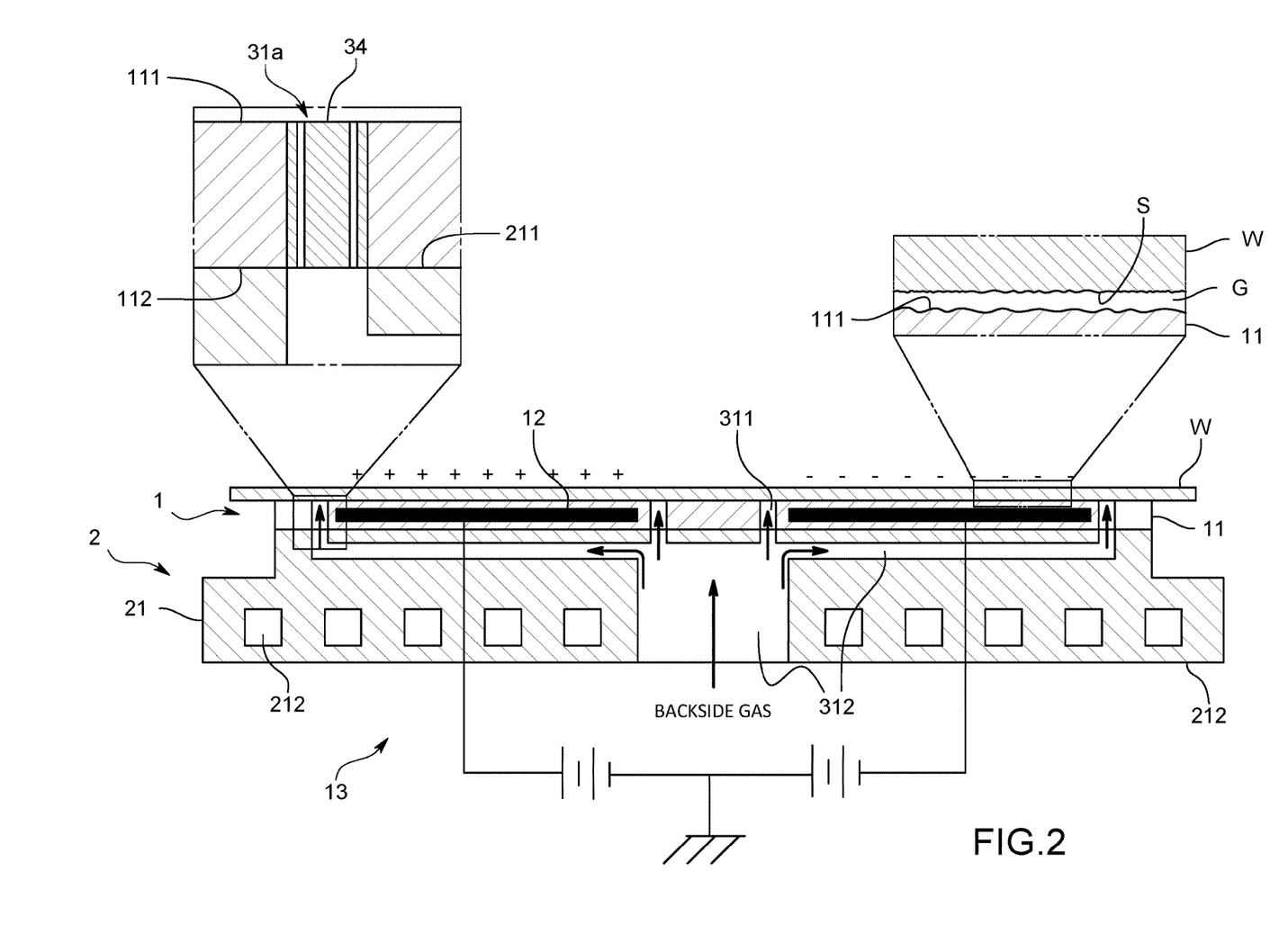
FIG. 2 is a cross-sectional view schematically showing the electrostatic chuck device of this embodiment.

As shown in FIG. 1, the electrostatic chuck device 100 of this embodiment is to electrostatically adsorb a wafer (W) as an object to be processed in a vacuum chamber (C) of a semiconductor manufacturing device using, for example, plasma. Concretely, as shown in FIG. 2, the electrostatic chuck device 100 comprises an electrostatic chuck section 1 having an adsorption surface 111, a cooling section 2 having a cooling surface 211 for cooling the electrostatic chuck section 1, and a gas supplying section 3 that supplies a thermally conductive gas (also called as a backside gas) to a gap (G) between the adsorption surface 111 of the electrostatic chuck section 1 and an adsorbed surface (S) of the wafer (W). The vacuum chamber (C) is configured to be evacuated by the vacuum pump (V1).

Figure 3:
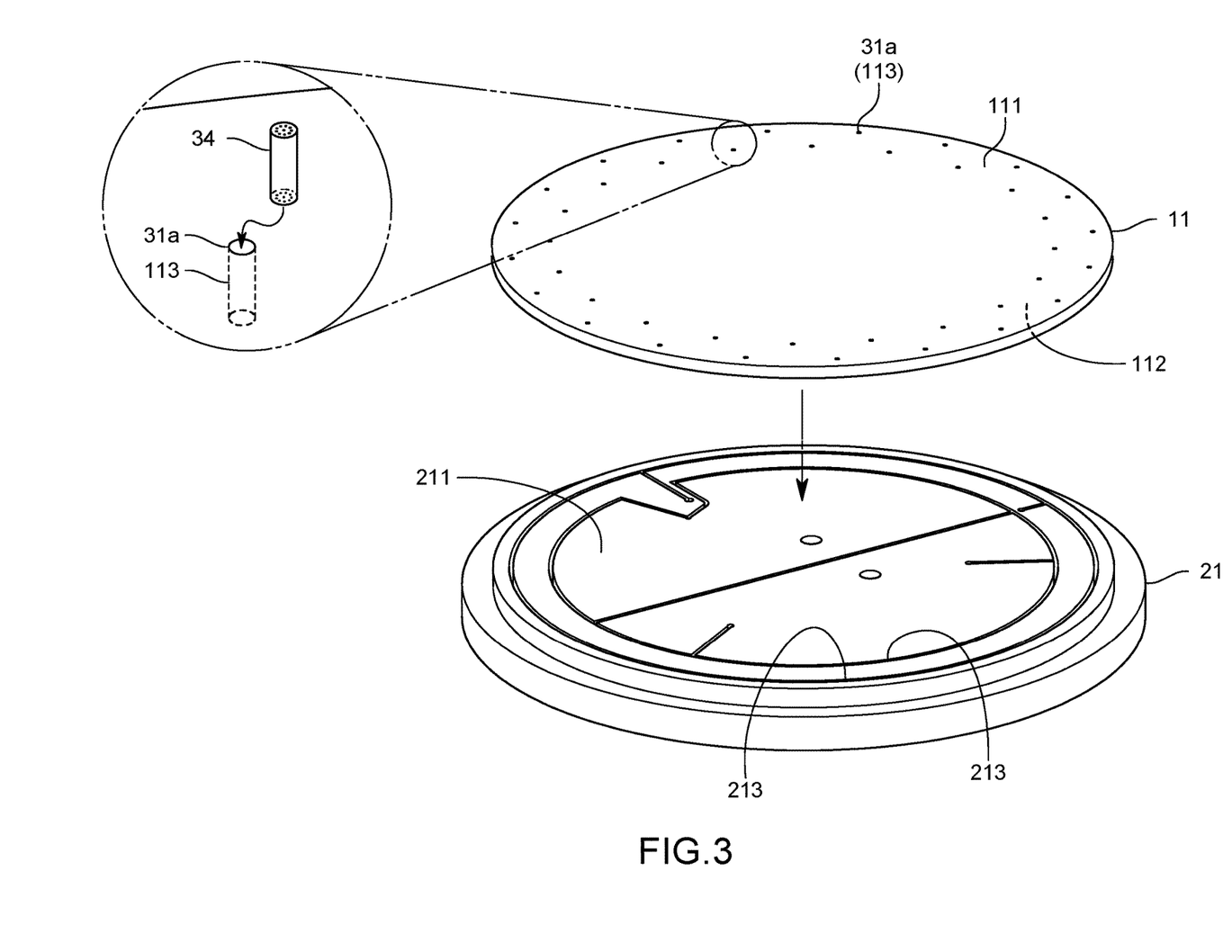
FIG. 3 is a perspective view schematically showing a configuration of the electrostatic chuck section and a cooling section of this embodiment.

As shown in FIG. 2 and FIG. 3, the electrostatic chuck section 1 comprises an adsorption plate 11, which is a circular flat plate made of an insulator such as ceramics or glass, an inner electrode 12 embedded in the adsorption plate 11, and a power supply 13 that applies a voltage to the inner electrode 12. By applying a voltage to the inner electrode 12 by the power supply 13, a dielectric polarization phenomenon occurs in the adsorption plate 11, causing the top surface 111 of the adsorption plate 11 to become a roughly flat adsorption surface. The electrostatic chuck section 1 of this embodiment is of a bipolar type, however, it can also be of a monopolar type.

Figure 4:
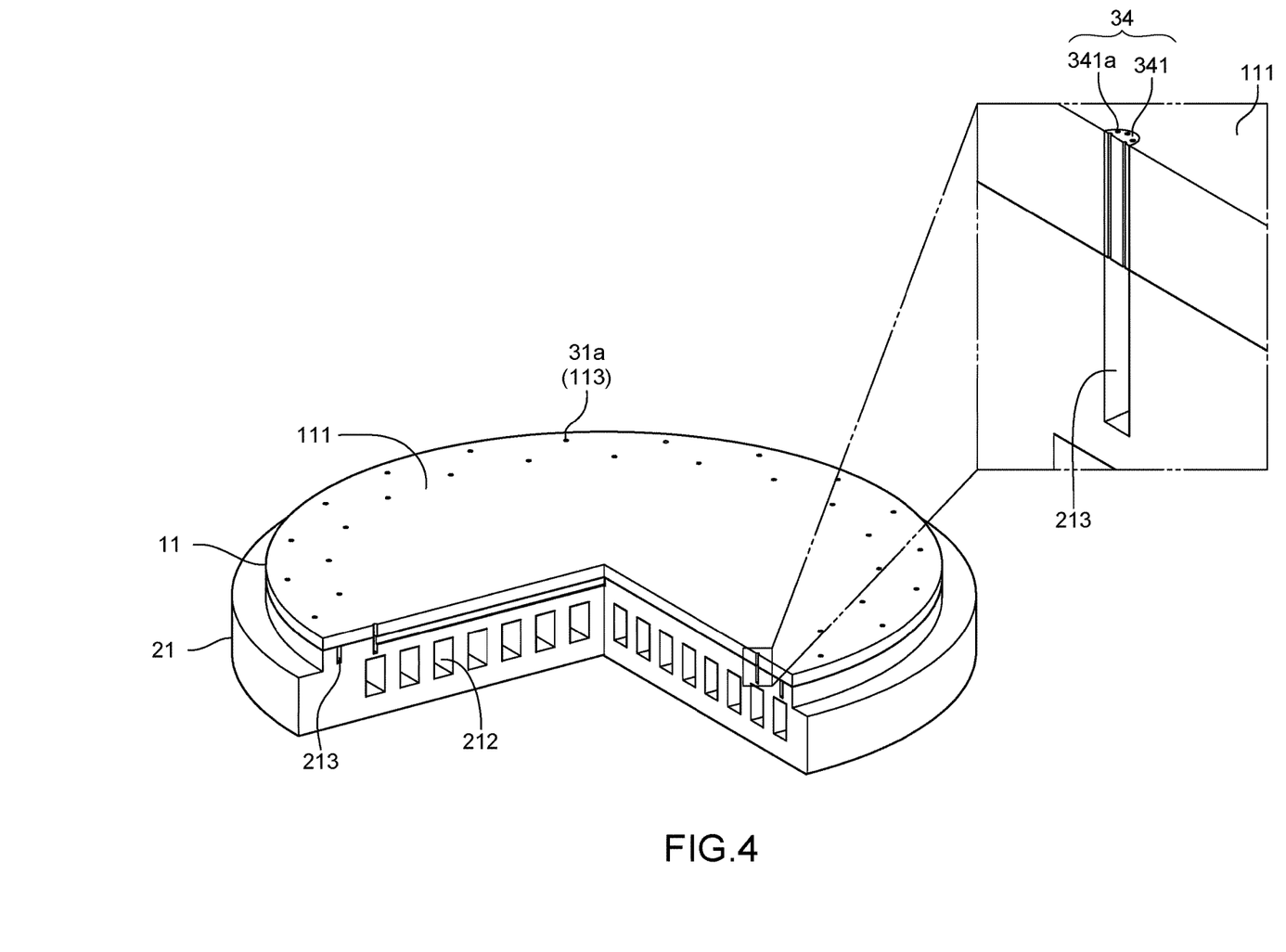
FIG. 4 is a perspective view schematically showing the electrostatic chuck and the cooling section of this embodiment.

As shown in FIG. 2 through FIG. 4, the cooling section 2 comprises a metal base plate 21 that forms a circular flat plate made of metal, a refrigerant flow channel 212 formed in the base plate 21, and a refrigerant distribution mechanism (not shown in drawings) such as a chiller that distributes the refrigerant in the refrigerant flow channel 212. By flowing the refrigerant in the refrigerant flow channel 212 by the refrigerant distribution mechanism, the temperature of the entire base plate 21 is lowered and the top surface 211 of the base plate 21 becomes a roughly flat cooling surface. The above-mentioned adsorption plate 11 is placed on the base plate 21 so that a bottom surface 112 (a back surface) makes surface-contact with the cooling surface 211 of the base plate 21. The refrigerant flow channel 212 is formed along a direction parallel to the cooling surface 211 in the inside of the base plate 21.

Figure 5:
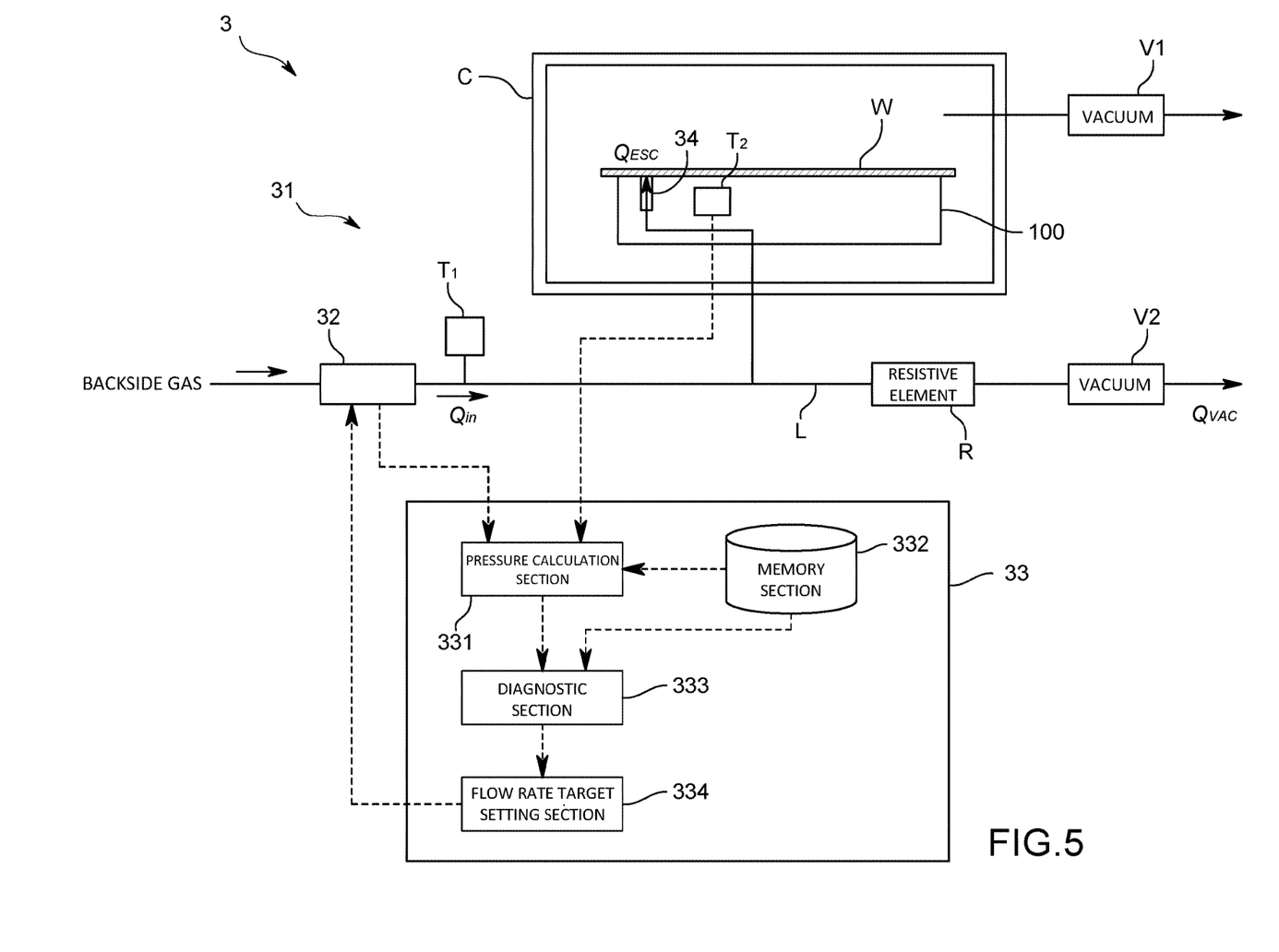
FIG. 5 is a view schematically showing a configuration of a gas supplying section of this embodiment.

As shown in FIG. 5, the gas supplying section 3 comprises a gas supplying line 31 provided with a flow rate controller 32 for controlling a flow rate of the thermally conductive gas, a control device 33 for controlling the flow rate controller 32 and a leak line (L) that branches off from the gas supplying line 31. The thermally conductive gas may be any gas, such as helium gas, argon gas, or a mixture of several gases in an arbitrary ratio.

The gas supplying line 31, whose upstream side is connected to a gas supply source (not shown), supplies the thermally conductive gas from a gas supplying port 31a arranged at a downstream end to the gap (G) between the adsorption surface 111 and the adsorbed surface (S) of the wafer (W). This gas supplying port 31a is formed on the adsorption surface 111 of the adsorption plate 11.

Concretely, the gas supplying line 31 comprises a first internal flow channel (the gas supplying flow channel in claims) 311 formed in the adsorption plate 11, and a second internal flow channel 312 formed in the base plate 21 to communicate with the first internal flow channel 311, and a piping flow channel (not shown in drawings) that communicates with the second internal flow channel 312 and that is formed by piping that connects the base plate 21 and the gas supplying source.

As shown in FIG. 2 and FIG. 4, a plurality of the first internal flow channels 311 are so configured to pass through the adsorption plate 11 in a direction of thickness and to open on the adsorption surface 111. Each opening of the first internal flow channel 311 on the adsorption surface 111 serves as a gas supplying port 31a. Each gas supplying port 311a is formed to be rotationally symmetrical with the symmetry axis being the rotational axis of the adsorption plate 11. In this embodiment, each of the first internal flow channels 311 is formed in a plurality (in this embodiment, two rows) so as to form concentric circular rows at an outer circumferential part of the adsorption plate 11 at equal intervals along the circumferential direction in each row.

Concretely, each of the first internal flow channels 311 comprises a straight through hole 113 whose cross-sectional shape is a circle that passes through the adsorption plate 11 in the direction of plate thickness. The through holes 113 have a diameter dimension (inner diameter) of several μm to several tens of μm (for example, 0.03 mm) and a length (along the axial direction) of about several millimeters (for example, 2 mm), however, these dimensions may be changed as needed.

The second internal flow channel 312 is formed to penetrate the base plate 21 in the direction of the plate thickness, and the upstream end of the second internal flow channel 312 is open to a bottom surface of the base plate 21, and the downstream end thereof is open to a top surface (a cooling surface) 211 of the base plate 21 so that the second internal flow channel 312 communicates with the first internal flow channel 311.

As shown in FIG. 2 and FIG. 3, a groove 213 is formed on the top surface 211 of the base plate 21 along the inside surface direction, and at least a part of the groove 213 penetrates the base plate 21 in the direction of the plate thickness and opens to the bottom surface. The second internal flow channel 312 is constituted by the inner surface of the groove 213 and the bottom surface 112 of the adsorption plate 11 by placing the adsorption plate 11 on the groove 213 so as to put a lid on the groove 213. The groove 213 is formed so as to pass directly below each of the through holes 113 of the adsorption plate 11 in a state wherein the adsorption plate 11 is placed on the base plate 21.

The flow rate controller 32 measures and controls a flow rate of the gas passing through the flow rate controller 32 and is arranged in the piping flow channel. The flow rate controller 32 is a so-called pressure type mass flow controller having a pressure sensor that measures the pressure of the passing gas, a flow rate sensor that measures the flow rate of the gas, a fluid control valve and a valve controller that controls the opening degree of the fluid control valve. The flow rate controller 32 performs feedback control of the opening degree of the fluid control valve so as to make the measured gas flow rate coincide with a target value set by the control device 33.

The control device 33 is a general-purpose or dedicated computer with a built-in CPU and internal memory. The control device 33 performs a function at least as a flow rate target setting section 334 that sets the target value of the flow rate of the flow rate controller 32 with the CPU and its peripheral devices cooperatively working based on a predetermined program stored in the internal memory, as shown in FIG. 5.

The leak line (L) branches off from the downstream of the flow rate controller 32 in the gas supplying line 31. The leak line (L) is configured to evacuate the gas by a vacuum pump V2 through an arbitrary resistive element (R) (for example, an orifice or the like) through which a fixed flow rate of the gas passes.

Then, the electrostatic chuck device 100 of this embodiment has an arrangement wherein a flow rate resistive element 34 is provided for each of the first internal flow channels 311 of the gas supplying line 31.

The flow rate resistive element 34 becomes a resistance in case that the thermally conductive gas flows and comprises inherent flow rate characteristic that determine a mass flow rate of the gas passing through the flow rate resistive element 34 based on a primary side pressure, a secondary side pressure and gas temperature. In this embodiment, the flow rate resistive element 34 is a laminar flow element resistive element. In this embodiment, the flow rate of the thermally conductive gas passing through the flow rate resistive element 34 is determined based on the pressure (the primary side pressure) of the thermally conductive gas in the gas supplying line 31, the pressure (the secondary side pressure, hereinafter also referred as the wafer back-surface pressure) of the thermally conductive gas in the gap (G) between the adsorption surface 111 and the adsorbed surface (S) and the temperature of the thermally conductive gas passing through the laminar flow element resistive element 34.

Concretely, the laminar flow element resistive element 34 is made of a flow channel forming member 341 having a flow channel (hereinafter also referred to as a resistance flow channel) that serves as the resistance. The flow channel forming member 341 has a cylindrical shape with a diameter dimension (an outer diameter) and a length dimension (a dimension along the axial direction) each of which is generally the same as the diameter dimension (an inner diameter) and a length of the through hole 113 of the adsorption plate 11. As shown in FIG. 4, each of the flow channel forming members 341 is fitted into each of the through holes 113 of the adsorption plate 11 with a fitting tolerance between the flow channel forming member 341 and the through hole 113. The flow channel forming member 341 may be made of any arbitrary insulating material such as ceramic or the like. It is preferable that an end surface in the downstream side of the resistive element 341 is flush with the adsorption surface 111 of the adsorption plate 11.

One or more resistive flow channels 341a are formed along the axial direction of the flow channel forming member 341. Each of the resistive flow channels 341a may be represented by the resistive flow channel that passes through the flow channel forming member 341 in the axial direction and that is in a shape of a straight line with a circular shape in cross-section or by a plurality of flow channels that are regularly arranged around the axis.

The electrostatic chuck device 100 of this embodiment is characterized by that the control device 33 further produces functions as a pressure calculation section 331, a memory section 332 and a diagnostic section 333.

Then, in the electrostatic chuck device 100 of this embodiment, the pressure calculation section 331 is configured to calculate a wafer back-surface pressure $P_{wafer}$ based on the mass flow rate $Q_{ESC}$ of the conductive gas supplied from the gas supplying port 31a, the primary side pressure $P_1$ of the laminar flow element resistive element 34 and the inherent flow rate characteristic comprised by the laminar flow element resistive element 34. The mass flow rate $Q_{ESC}$ is the mass flow rate of the first internal flow channel 311 (the through hole 113) formed in the adsorption plate 11. In this embodiment wherein the laminar flow element resistive element 34 is arranged in the through hole 113, the mass flow rate $Q_{ESC}$ is the mass flow rate of the thermally conductive gas passing through the laminar flow element resistive element 34.

Concretely, the pressure calculation section 331 is configured to calculate the mass flow rate $Q_{ESC}$ of the thermally conductive gas supplied from the gas supplying port 31a based on the following expression (1) indicating mass balance of the mass flow rate of the thermally conductive gas flowing in the gas supplying line 31 (more specifically, balance between an amount of the thermally conductive gas entering the gas supplying line 31 and the amount of the thermally conductive gas leaving from the gas supplying line 31) and the mass flow rate $Q_{in}$ of the thermally conductive gas introduced into the gas supplying line 31. The pressure calculation section 331 is configured to calculate the wafer back-surface pressure $P_{wafer}$ based on the following expression (2) indicating relationship between the calculated mass flow rate $Q_{ESC}$ of the thermally conductive gas and the inherent flow rate characteristic comprised by the laminar flow element resistive element 34.

[Expression 1]

$$Q_{in} = Q_{ESC} + Q_{VAC} - \left(\frac{V}{ZR_uT_{gas}}\right)\frac{dP}{dt} \quad (1)$$

In the expression (1),
$Q_{in}$: mass flow rate of thermally conductive gas introduced into gas supplying line 31,
$Q_{VAC}$: mass flow rate of thermally conductive gas exhausted from leak line (L) and passing through the resistive element (R),
$(V/Z \cdot R_u \cdot T_{gas}) \cdot (dP/dT)$: mass flow rate $Q_{LEAK}$ of thermally conductive gas leaking into chamber from gap between adsorption plate 11 and the wafer (W),
V: volume of flow channel between flow rate controller 32 and laminar flow element resistive element 34 in gas supplying line 31,
Z: compression coefficient of gas (Z=1, in this embodiment)
$R_u$: gas constant (8.3145 J·mol$^{-1}$·K$^{-1}$),
$T_{gas}$: average temperature of thermally conductive gas in flow channel from flow rate controller 32 to laminar flow element resistive element 34 in gas supplying line 31, and
dP/dt: time change of pressure of thermally conductive gas in flow channel from flow rate controller 32 to laminar flow element resistive element 34 in gas supplying line 31.
Considering that the surface quality (for example, shape, roughness, or the like) of the adsorption surface 111 of the adsorption plate 11 is not uniform and that the thermal energy exchange during the process is not stable, even after a sufficient amount of time has elapsed since the thermally conductive gas supply is started by gas supplying line 31, the mass flow rate $Q_{LEAK}$ does not reach a stable state (steady state) and dP/dt may not become zero.

In this embodiment, the pressure calculation section 331 is configured to obtain the mass flow rate $Q_{in}$ from the flow rate controller 32, to obtain the average temperature $T_{gas}$ from a thermometer $T_1$ arranged in the gas supplying line 31, and to obtain the mass flow rate $Q_{VAC}$ of the leak gas, the volume (V) of the flow channel, the compression factor (Z) and the gas constant $R_u$ from the memory section 332, and to calculate the mass flow rate $Q_{ESC}$ of the thermally conductive gas supplied from the gas supplying port 31a based on the obtained values and the expression (1).

[Expression 2]

$$Q_{ESC} = f_{res}(P_1, P_{wafer}, T_{ESC}) \quad (2)$$

In the expression (2), $f_{res}$: function indicating flow rate characteristic of laminar flow element resistive element 34, $P_1$: primary side (upstream side) pressure applied to laminar flow element resistive element 34, $P_{wafer}$: pressure on back-surface of wafer (pressure on secondary side applied to laminar flow element resistive element 34), $T_{ESC}$: temperature of thermally conductive gas passing through laminar flow element resistive element 34 (in this embodiment, it is considered to be equal to temperature of the adsorption plate 11).

The pressure calculation section 331 is configured to obtain the primary side pressure $P_1$ measured by the flow rate controller 32, to obtain the temperature $T_{ESC}$ of the thermally conductive gas from an optical fiber type thermometer $T_2$ that measures the temperature of the adsorption plate 11, to obtain the flow rate characteristic function $f_{res}$ from the memory section 332, and to calculate the wafer back-surface pressure $P_{wafer}$ based on the obtained values and the expression (2). The flow rate characteristic function $f_{res}$ stored in advance in the memory section 332 is a map or the like expressed by a function wherein the primary side pressure $P_1$ applied to the laminar flow element resistive element 34, the secondary side pressure $P_{wafer}$ applied to the laminar flow element resistive element 34, and the temperature $T_{ESC}$ of the thermally conductive gas passing through the laminar flow element resistive element 34 are input variables and the mass flow rate passing through the laminar flow element resistive element 34 are output variables.

The diagnostic section 333 diagnoses whether or not there is abnormality on the adsorbed surface (S) of the wafer (W). Concretely, the diagnostic section 333 is configured to determine whether or not there is abnormality on the adsorbed surface (S) of the wafer (W) by comparing the wafer back-surface pressure $P_{wafer}$ calculated by the pressure calculation section 331 with the predetermined pressure $P_s$ stored in the memory section 332 in advance. For example, if an absolute value of the difference between the wafer back-surface pressure $P_{wafer}$ and the pressure $P_s$ is greater than or equal to a predetermined value, it is diagnosed that the abnormality has occurred on the adsorbed surface (S) of the wafer (W). If the value is less than or equal to the predetermined value, it is diagnosed as normal. The pressure $P_s$ is set appropriately according to a content of the vacuum processing on the wafer (W).

The above-mentioned flow rate target setting section 334 is configured to set a flow rate target value of the flow rate controller 32 and to send the flow rate target value to the flow rate controller 32 so that the wafer back-surface pressure $P_{wafer}$ calculated by the pressure calculation section 331 falls within a predetermined range. Concretely, the flow rate target setting section 334 is configured to compare the wafer back-surface pressure $P_{wafer}$ calculated by the pressure calculation section 331 with the target value $P_t$ stored in the memory section 332 in advance and to set the flow rate target value based on a predetermined relational expression calculated in advance through experiments or simulations so that the absolute value of the difference falls within the predetermined range.

In accordance with the electrostatic chuck device 100 having the above-mentioned arrangement, since the flow rate resistive element 34 whose flow rate characteristic $f_{res}$ is known in advance is arranged in the first internal flow channel 311 that communicates with the gas supplying port 31a of the gas supplying line 31, it is possible to grasp the wafer back-surface pressure $P_{wafer}$ by making use of the flow rate characteristic $f_{res}$ and the primary side pressure $P_1$ of the flow rate resistive element 34. In accordance with this arrangement, it becomes possible to contribute to improving the accuracy of the processed dimension of the wafer (W) and also possible to identify occurrence of abnormalities or symptom of the abnormalities such as a decrease in the stability of the adsorption force due to aging deterioration. Furthermore, since the flow rate resistive element 34, which serves as a resistance to the flow of the thermally conductive gas, is provided in the first internal flow channel 311 to block the gas supplying port 31a, it is possible to prevent an excessive amount of the thermally conductive gas from flowing out through the gas supplying port 31a while de-chucking of the wafer (W) or cleaning of the processing chamber.

The present claimed invention is not limited to the above-mentioned embodiment.

Figure 6:
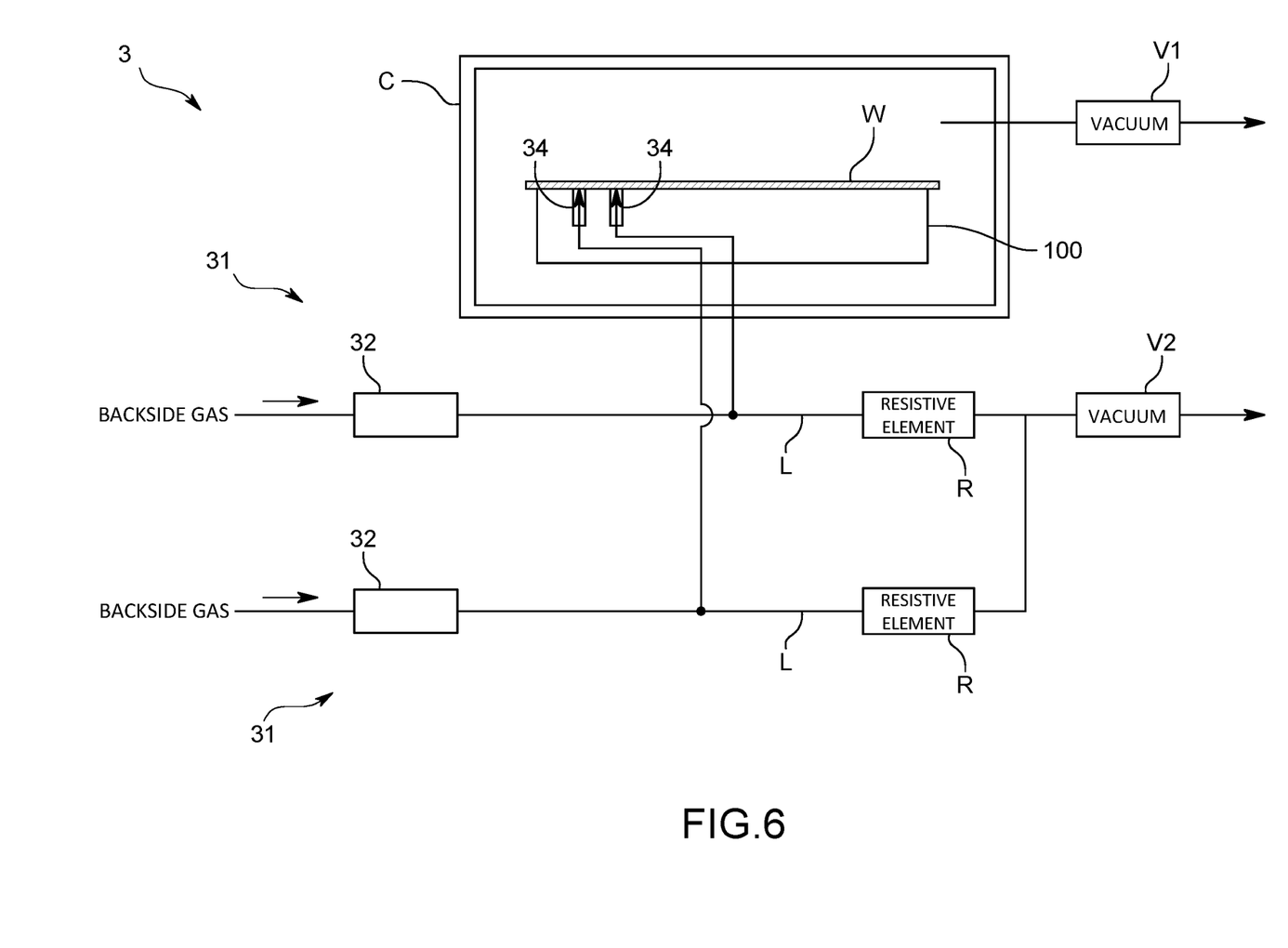
FIG. 6 is a view schematically showing the gas supplying section of the other embodiment.

For example, as shown in FIG. 6, the electrostatic chuck device 100 of the other embodiment may comprise a plurality of gas supplying lines 31, and each of the gas supplying lines 31 may supply the thermally conductive gas to a mutually different area between the adsorption surface 111 of the adsorption plate 11 and the adsorbed surface (S) of the wafer (W). In this case, the adsorption surface 111 of the adsorption plate 11 may be divided into a plurality of the gas supplying areas corresponding to the number of the gas supplying lines 31, and the gas supplying lines 31 may be configured to supply the thermally conductive gas individually from the gas supplying port $31_a$ provided in each of the gas supplying areas. The type, the flow rate, and the wafer back-surface pressure of the thermally conductive gas supplied from each of the gas supplying lines 31 may be set for each of the gas supplying lines 31.

Figure 7:
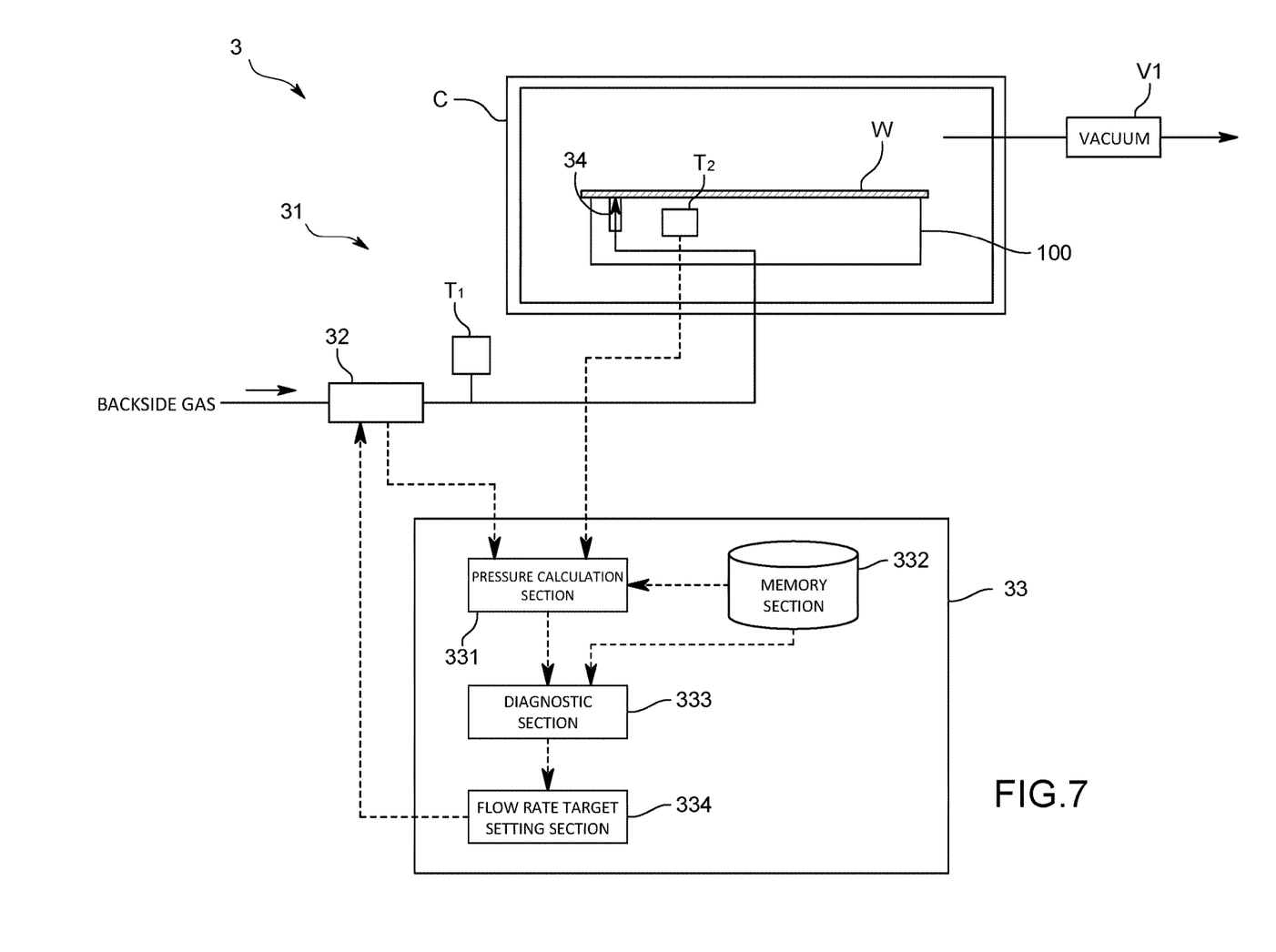
FIG. 7 is a view schematically showing the gas supplying section of the other embodiment.

In addition, the electrostatic chuck device 100 of the other embodiment may have an arrangement wherein the gas supplying section 3 is not provided with a leak line (L), as shown in FIG. 7. In this case, the pressure calculation section 331 may calculate $P_{wafer}$ in the above-mentioned expression (1) as "$Q_{VAC}=0$".

Furthermore, the electrostatic chuck device 100 of the above embodiment comprises the pressure type flow rate controller 32, however, it is not limited to this. If the electrostatic chuck device 100 of the present claimed invention is configured to measure the mass flow rate $Q_{in}$ of the thermally conductive gas introduced into the gas supplying line 31 and the pressure $P_1$ of the thermally conductive gas in the gas supplying line 31, it is possible to grasp the wafer back-surface pressure $P_{wafer}$.

Figure 8:
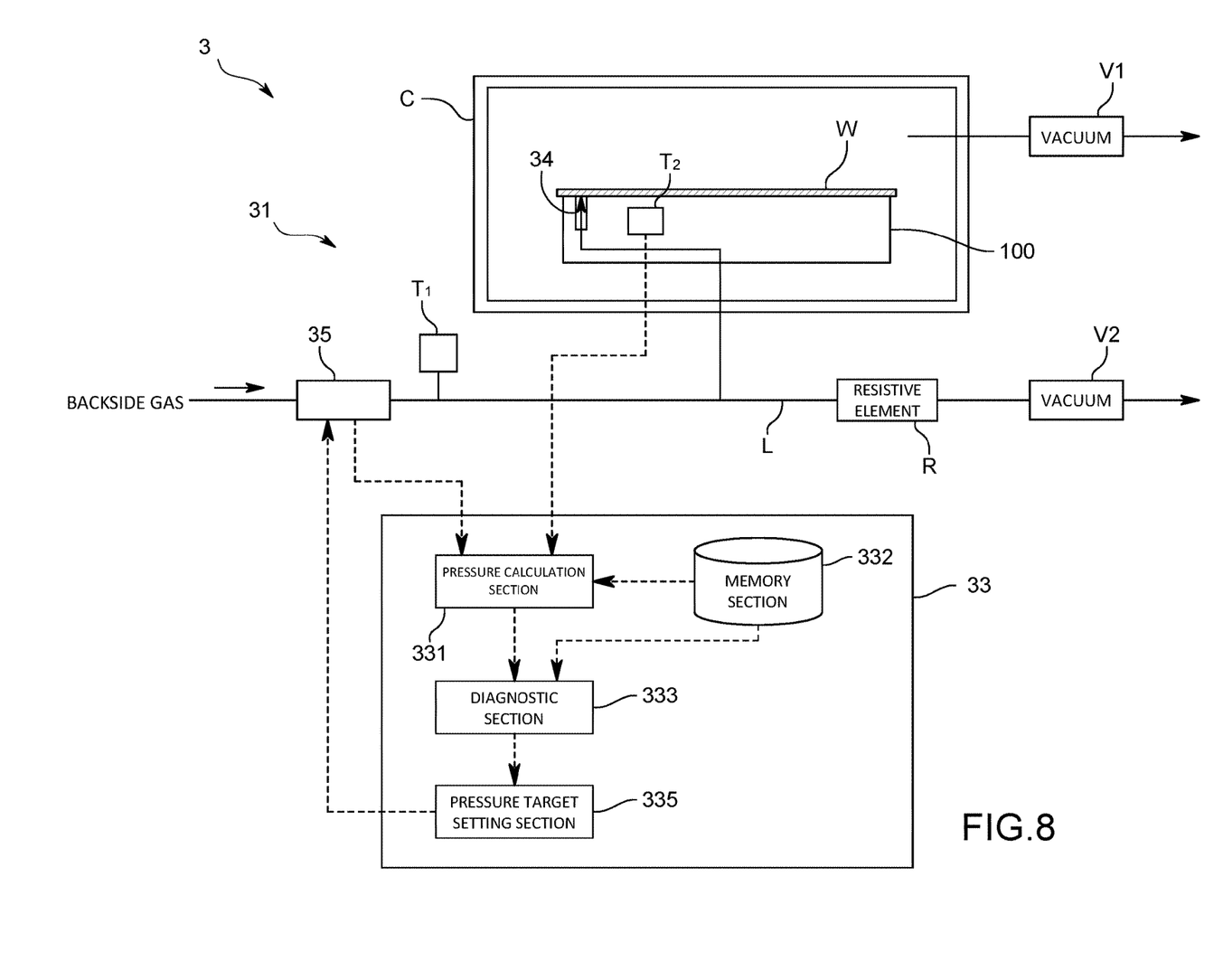
FIG. 8 is a view schematically showing the gas supplying section of the other embodiment.

As shown in FIG. 8, the electrostatic chuck device 100 of the other embodiment may be provided with, for example, a pressure controller 35 that measures and controls the pressure of the thermally conductive gas in the gas supplying line 31, instead of the flow rate controller 32. A concrete embodiment of the pressure controller 35 may be represented by comprising a flow rate sensor, a fluid control valve, a pressure sensor, and a valve controller that feedback-controls the opening degree of the fluid control valve based on the output of the pressure sensor. Even in such an embodiment, it is possible for the pressure calculation section 331 to calculate the wafer back-surface pressure $P_{wafer}$ by using the pressure value measured by the pressure controller 35 as the primary side pressure $P_1$ of the flow rate resistive element 34, and by using the flow rate value measured by the flow rate sensor comprised by the pressure controller 35 as the flow rate $Q_{in}$ of the thermally conductive gas introduced into the gas supplying line 31.

Figure 9:
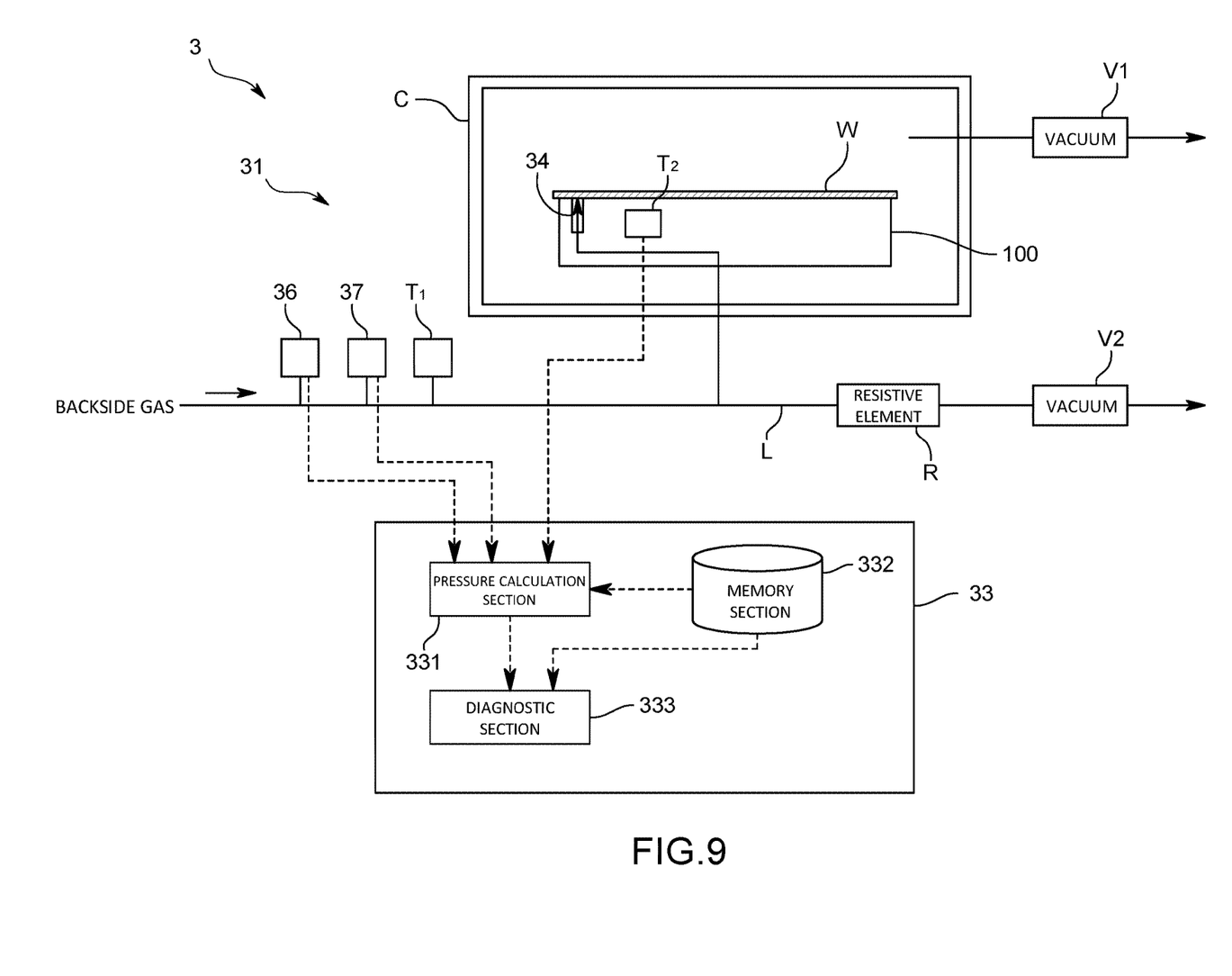
FIG. 9 is a view schematically showing the gas supplying section of the other embodiment.

In addition, it is not limited to this and as shown in FIG. 9, the electrostatic chuck device 100 may comprise a flow meter 36 such as a mass flow meter that measures the mass flow rate $Q_{in}$ of the thermally conductive gas introduced into the gas supplying line 31, and a pressure meter 37 that measures the pressure $P_1$ of the thermally conductive gas in the gas supplying line 31, instead of the flow rate controller 32.

In the above-mentioned embodiment, the flow rate resistive elements 34 are provided for all of the plurality of the first internal flow channels 311, however, it is not limited to this. In the other embodiment, the flow rate resistive element 34 may be provided in only some of the plurality of first internal flow channels 311.

In addition, in the above-mentioned embodiment, the flow rate resistive element 34 is arranged in the first internal flow channel 311, however, it is not limited to this. In the other embodiment, the flow rate resistive element 34 may be formed in the second internal flow channel 312 or in a flow channel of the gas supplying line 31 that communicates with the gap (G) such as a pipe flow channel (not shown in drawings) that connects a gap between the base plate 21 and the gas supplying source. In order to calculate the wafer back-surface pressure more accurately, it is preferable that the flow rate resistive element 34 is arranged in a downstream side of the gas supplying line 31.

The flow rate resistive element 34 in the above-mentioned embodiment is the laminar flow element resistive element, however, it is not limited to this. The flow rate resistive element 34 may be any flow rate resistive element as far as it has the flow characteristic that the flow rate of the thermally conductive gas passing through the flow rate resistive element 34 is determined by the pressure on the primary side and the pressure on the secondary side.

In addition, the flow rate resistive element 34 may not be a resistive element arranged in the flow channel comprised by the gas supplying line 31. The flow rate resistive element 34 may be, for example, the flow channel itself (such as the first internal flow channel 311, or the like) provided by the gas supplying line 31 with known flow characteristic. Even if with this configuration, it is possible to grasp the wafer back-surface pressure by making use of the flow characteristic of the flow channel.

Figure 10:
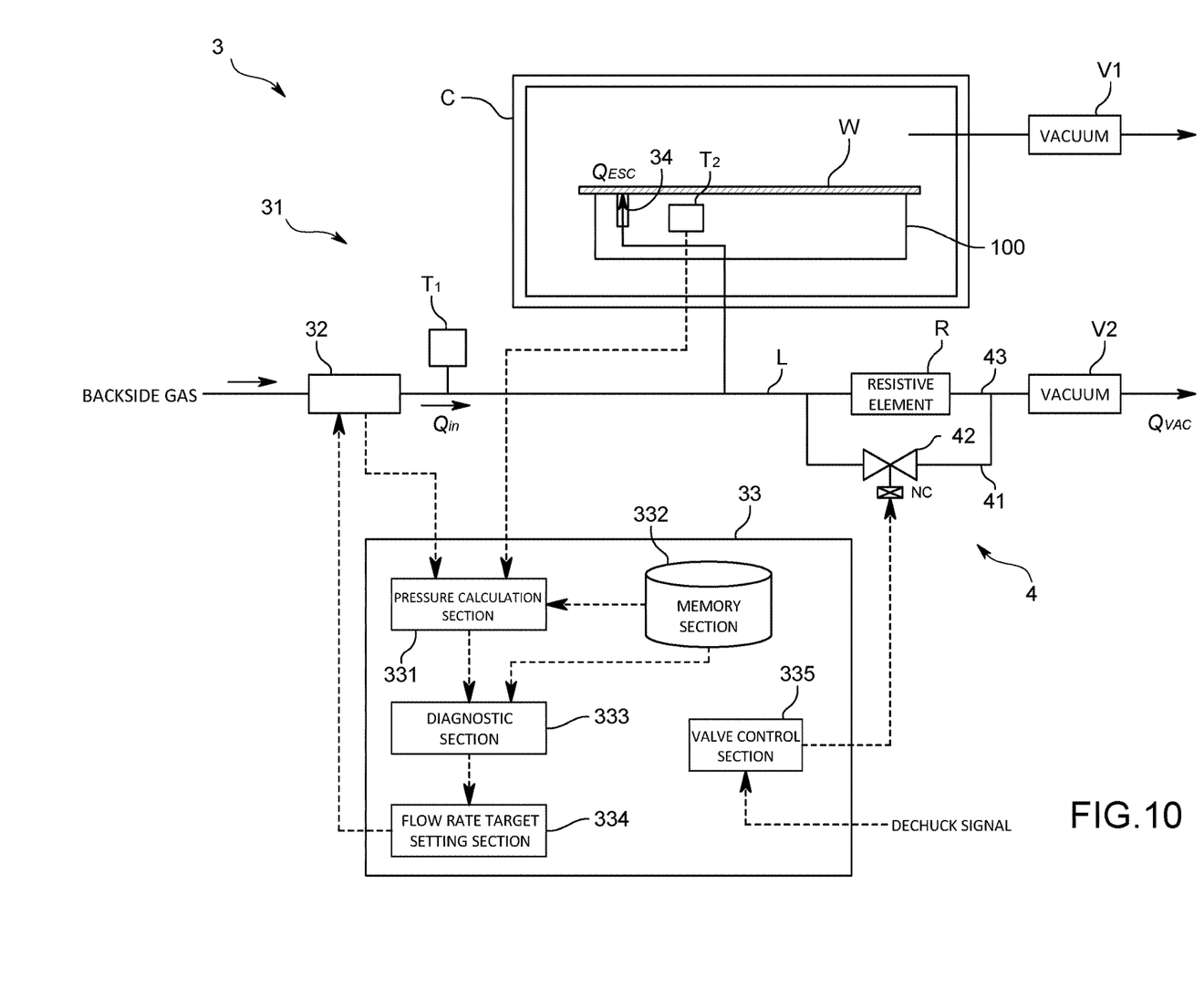
FIG. 10 is a view schematically showing the gas supplying section of the other embodiment.

The electrostatic chuck device 100 of the other embodiment comprises a resistance changing mechanism 4 that changes the magnitude of the flow channel resistance of the leak line (L) to the thermally conductive gas. Concretely, as shown in FIG. 10, the resistance changing mechanism 4 comprises a bypass line 41 arranged to bypass the resistive element (R) in the leak line (L), an open/close valve 42 arranged on the bypass line 41 and a valve control section 335 that controls the open/close valve 42. The bypass line 41 in this embodiment is arranged in the leak line (L) to branch in the upstream side of the resistive element (R) and to merge in the downstream side of the resistive element (R). In case that the open/close valve 42 is in the open state, the flow channel resistance (pipe channel resistance) of the bypass line 41 is set to be smaller than that of the main leak line 43 where the resistive element (R) is arranged. The open/close valve 42 is configured to switch between the open state and the close state according to the control signal from the valve control section 335 and is, for example, an air valve, a piezoelectric actuator valve, a solenoid actuator valve, a thermal actuator valve or the like. The open/close valve 42 is always closed (normally closed). The valve control section 335 is a function performed by the control section 33 and the function is to send control signals to the open/close valve 42 to switch its open/close state. When the valve control section 335 in this embodiment obtains a signal to release (de-chuck) the electrostatic adsorption of the wafer by the electrostatic chuck section 1, the valve control section 335 immediately sends a signal to the open/close valve 42 to release the open/close valve 42. Since the electrostatic chuck device 100 of the other embodiment comprises the resistance changing mechanism 4, it is possible to exhaust the thermally conductive gas immediately through the bypass line 41 in case that the electrostatic chuck section 1 is switched to the de-chucking state. This reduces the risk of sparking caused by the outflow of the thermally conductive gas into the vacuum chamber (C) immediately after the plasma processing is completed.

In case that the electrostatic chuck device 100 is provided with the resistance changing mechanism 4, the bypass line 41 may be configured to exhaust the thermally conductive gas by another vacuum pump without merging in the downstream side of the resistive element (R). The bypass line 41 may not be arranged to branch in the upstream side of the resistive element (R) in the leak line (L). For example, the bypass line 41 may be configured to branch in the upstream side or the downstream side of the branch point of the leak line (L) in the gas supplying line 31. In addition, the bypass line 41 may be provided with an arbitrary resistive element such as a flow rate resistive element. Even in such a case, if the flow rate resistance of the bypass line 41 is set to be smaller than that of the main leak line 43, in case that the electrostatic chuck section 1 switches to the de-chucking state, it is possible to immediately exhaust the thermally conductive gas through the bypass line 41.

In addition, the present claimed invention is not limited to the above-mentioned embodiments, and it goes without saying that various modifications are possible without departing from the spirit of the invention.

POSSIBLE APPLICATIONS IN INDUSTRY

In accordance with the electrostatic chuck device of the present claimed invention, it is possible to grasp the wafer back-surface pressure in the semiconductor manufacturing process using the electrostatic chuck device.

The invention claimed is:

1. An electrostatic chuck device for adsorbing an object by electrostatic force, comprising
an adsorption plate that has an adsorption surface for adsorbing the object,
a gas supplying line that supplies a thermally conductive gas to a gap between the adsorption surface and an adsorbed surface of the object, and
a pressure calculation section that calculates pressure of the thermally conductive gas in the gap, wherein
the gas supplying line is provided with a flow rate resistive element that acts as a resistance when the thermally conductive gas flows, and
the pressure calculation section is configured to calculate the pressure of the thermally conductive gas in the gap based on primary side pressure of the flow rate resistive element, which is a pressure on an upstream side of the flow rate resistive element, a flow rate of the thermally conductive gas that passes through the flow rate resistive element, and a flow rate characteristic of the flow rate resistive element, the flow rate characteristic indicating a relationship between the primary side pressure, a pressure on a downstream side of the flow rate resistive element, and the flow rate of the thermally conductive gas through the flow rate resistive element.

2. The electrostatic chuck device described in claim 1, wherein
the gas supplying line comprises a gas supplying flow channel formed in the adsorption plate so as to open on the adsorption surface, and
the flow rate resistive element is arranged in the gas supplying flow channel.

3. The electrostatic chuck device described in claim 1, wherein
the pressure calculation section calculates the flow rate of the thermally conductive gas that passes through the flow rate resistive element based on the flow rate of the thermally conductive gas introduced into the gas supplying line and a relational expression indicating a material balance of the flow rate of the thermally conductive gas in the gas supplying line.

4. The electrostatic chuck device described in claim 3, further comprising
a pressure controller on which a flow rate sensor is loaded and that measures and controls the pressure of the thermally conductive gas in the gas supplying line, wherein
the pressure calculation section calculates the pressure of the thermally conductive gas in the gap by using:
a pressure value measured by the pressure controller as the primary side pressure of the flow rate resistive element; and
a flow rate value measured by the flow rate sensor as the flow rate value of the thermally conductive gas introduced into the gas supplying line.

5. The electrostatic chuck device described in claim 3, further comprising
a pressure type flow rate controller that measures and controls the flow rate of the thermally conductive gas flowing in the gas supplying line, wherein
the pressure calculation section calculates the pressure of the thermally conductive gas in the gap by using;
a pressure value measured by the pressure type flow rate controller as the primary side pressure of the flow rate resistive element; and
a flow rate value measured by the pressure type flow rate controller as the flow rate value of the thermally conductive gas introduced into the gas supplying line.

6. The electrostatic chuck device described in claim 1, further comprising a diagnostic section that diagnoses an abnormality in a pressure value of the thermally conductive gas applied to the adsorbed surface by comparing the calculated pressure of the thermally conductive gas with a predetermined reference pressure.

7. The electrostatic chuck device described in claim 1, wherein the pressure of the thermally conductive gas in the gas supplying line is adjusted so that the calculated pressure of the thermally conductive gas falls a value within a predetermined range.

8. The electrostatic chuck device described in claim 1, wherein the flow rate of the thermally conductive gas flowing in the gas supplying line is adjusted so that the calculated pressure of the thermally conductive gas falls a value within a predetermined range.

9. The electrostatic chuck device described in claim 1, wherein
a plurality of gas supplying lines are provided, and each of the gas supplying lines is configured to supply the thermally conductive gas to a mutually different area between the adsorption surface and the adsorbed surface.

10. The electrostatic chuck device described in claim 1, wherein
the gas supplying line is configured to supply multiple types of the thermally conductive gases in an arbitrary mixing ratio.

11. The electrostatic chuck device described in claim 1, comprising:
a main leak line that branches off from the gas supplying line and that is provided with a resistive element;
a bypass line arranged to bypass the resistive element;
an open/close valve arranged on the bypass line; and
a valve control section that controls the open/close valve, wherein
a flow channel resistance of the bypass line is configured to be smaller than the flow channel resistance of the main leak line.

12. A pressure calculation method in an electrostatic chuck device that adsorbs an object by electrostatic force, wherein the electrostatic chuck device comprises an adsorption plate having an adsorption surface that adsorbs the object, and a gas supplying line that supplies a thermally conductive gas to a gap between the adsorption surface and the adsorbed surface of the object, and a flow rate resistive element that acts as a resistance when the thermally conductive gas flows is arranged in the gas supplying line, the method comprising:
calculating the pressure of the thermally conductive gas in the gap based on a primary side pressure of the flow rate resistive element, which is a pressure on an upstream side of the flow rate resistive element, a flow rate of the thermally conductive gas passing through the flow rate resistive element, and a flow characteristic of the flow rate resistive element, wherein the flow characteristic indicates a relationship between the primary side pressure, a pressure on a downstream side of the flow rate resistive element, and the flow rate of the thermally conductive gas through the flow rate resistive element.

13. A computer including memory storing a pressure calculation program for an electrostatic chuck device that adsorbs an object by electrostatic force, the electrostatic chuck device comprising an adsorption plate having an adsorption surface that adsorbs the object, and a gas supplying line that supplies a thermally conductive gas to a gap between the adsorption surface and the adsorbed surface of the object, and a flow rate resistive element that acts as a resistance when the thermally conductive gas flows is arranged in the gas supplying line, wherein
the pressure calculation program causes the computer to function as a pressure calculation section that is configured to calculate the pressure of the thermally conductive gas in the gap is calculated based on a primary side pressure of the flow rate resistive element, which is a pressure on an upstream side of the flow rate resistive element, a flow rate of the thermally conductive gas passing through the flow rate resistive element, and a flow characteristic of the flow rate resistive element, the flow characteristic indicating a relationship between the primary side pressure, a pressure on a downstream side of the flow rate resistive element, and the flow rate of the thermally conductive gas through the flow rate resistive element.

* * * * *